June 30, 1964

W. KAMINSKI ETAL 3,139,593

MULTIFREQUENCY GENERATORS

Filed Dec. 29, 1961

2 Sheets-Sheet 1

INVENTORS: W. KAMINSKI
H. A. SCHNEIDER

BY [signature]

ATTORNEY

June 30, 1964 W. KAMINSKI ETAL 3,139,593

MULTIFREQUENCY GENERATORS

Filed Dec. 29, 1961

2 Sheets-Sheet 2

INVENTORS: W. KAMINSKI
H. A. SCHNEIDER

BY [signature]

ATTORNEY

United States Patent Office 3,139,593

Patented June 30, 1964

3,139,593

MULTIFREQUENCY GENERATORS

William Kaminski, West Portal, and Herbert A. Schneider, Millington, N.J., assignors to Bell Telephone Laboratories, Incorporated, New York, N.Y., a corporation of New York Filed Dec. 29, 1961, Ser. No. 163,345
5 Claims. (Cl. 331—19)

This invention relates to multifrequency generators and more particularly to frequency stabilization of multifrequency generators.

Multifrequency generators are commonly employed in mobile radio telephone applications, where the Federal Communication Commission has allocated 11 channels in the 150 megacycle range and 12 channels in the 450 megacycle range. The present equipment that is available does not effectively utilize all of the channels allocated in a particular frequency range. Most of the present equipment, for example, makes provision for the use of no more than 4 of the 11 or 12 channels. Even then the provision of 4 channels is made by the employment of a crystal for each channel plus another crystal in an interpolation oscillator to bring the frequency up to the frequency of propagation. In any mobile radio system, one of the expenses is the provision of crystals for stability. If a system were to utilize, for example, all 11 channels in the 150 megacycle range, it would be necessary to provide 12 crystals with a resulting burden of expense.

Therefore, it is desirable to provide a plurality of channels without the necessity of a crystal for each channel and yet retain the stability offered by crystals. One way of doing this is to use a phase-locked oscillator as a sharp filter to select a particular harmonic from a harmonic generator which is subsequent to and operates upon the output of a single crystal oscillator.

However, when a phase-locked oscillator is employed in a multifrequency generator, the tuning of the variable frequency oscillator therein by its frequency determining circuits, as the frequency of operation is changed, will cause a nonlinear relationship to exist between the channels. Additionally, the fine tuning elements, which are responsive to the phase loop, may also adversely affect the linearity between the channels. A further effect of this (tuning) and the varying of the fine tuning elements is to cause the fine tuning range of the phase-locked oscillator to be dependent upon the frequency of operation.

This nonlinearity and variable fine tuning range will most probably result in interference between the channels and instability in operation, thereby destroying the advantage of the use of a phase-locked oscillator.

Therefore, it is an object of the present invention to provide a multifrequency generator having an essentially constant fine tuning range, wherein the output channels are equally spaced apart in frequency and non-interfering.

It is additionally an object of this invention to provide a multifrequency generator having a linear control over the frequency of operation, so that the frequencies even at the extremes of the operating range are linearly related to prevent interference between the channels.

In accordance with the invention, therefore, a multifrequency generator employs a phase-locked oscillator as a sharp filter to select the desired frequency of operation from the output of a harmonic generator, which produces the harmonics from the output of a crystal oscillator. The phase-locked oscillator includes a variable frequency oscillator, which has a parallel resonant circuit that determines the particular frequency of operation. The variable frequency oscillator is coarsely tuned by adding an inductor in parallel with the initial inductance and a capacitor in series with the initial capacitance so that the resonant circuit presents a substantially constant L/C ratio to the variable frequency oscillator. Additionally, the variable frequency oscillator has a fine tuning control, which is in parallel with only one portion of the capacitance of the resonant circuit, so that its effect is substantially constant over the entire range of oscillator operation, thereby yielding a constant fine tuning range for each channel in the phase-locked oscillator independent of the coarse tuning.

These and other features and advantages of the invention will appear more clearly and fully upon consideration of the following specification taken in connection with the drawing in which.

Figure 1:
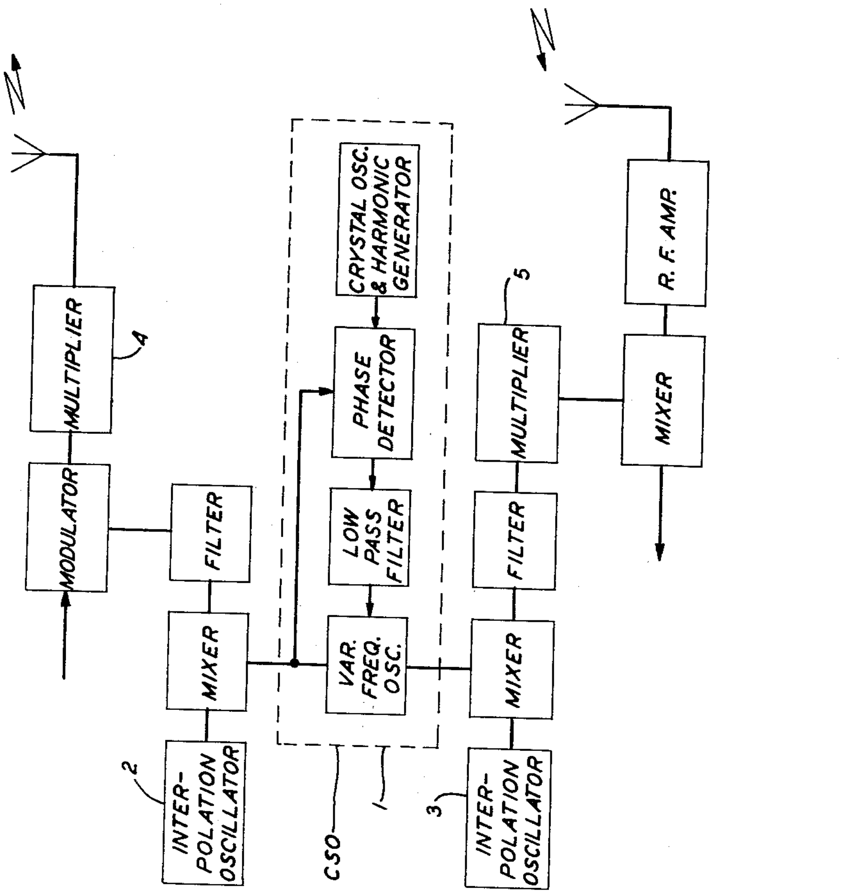
FIG. 1 is a block diagram of a representative application in a mobile radio telephone system of a channel select oscillator in accordance with the present invention.

The mobile radio telephone equipment of FIG. 1 is one of the many possible applications where it is desirable to have a channel select oscillator producing a plurality of output frequencies having a constant bandwidth and linear relationship. The particular application herein described can only utilize a maximum of 11 or 12 channels in the 150 megacycle or 450 megacycle range, respectively, in accordance with the Federal Communication Commission's allocations and regulations. However, it is often desirable to have a source that will produce as many as 2,000 or more discrete channels having a constant bandwidth and linear relationship. In such applications the channel select oscillator of FIG. 2 may be advantageously employed as a basic unit in a frequency synthesizer or adder as disclosed, for example, in our copending applications Serial No. 163,346, filed December 29, 1961, and Serial No. 163,347, filed December 29, 1961 filed concurrently herewith.

The mobile radio equipment of FIG. 1 is a typical transceiver having a transmitting section and a receiving section. A channel select oscillator 1 determines the spacing between channels and the number of channels available and interpolation oscillators 2 and 3 of the transmitting and receiving sections, respectively, in conjunction with their respective multipliers 4 and 5, determine the frequency of operation of the transceiver.

Figure 2:
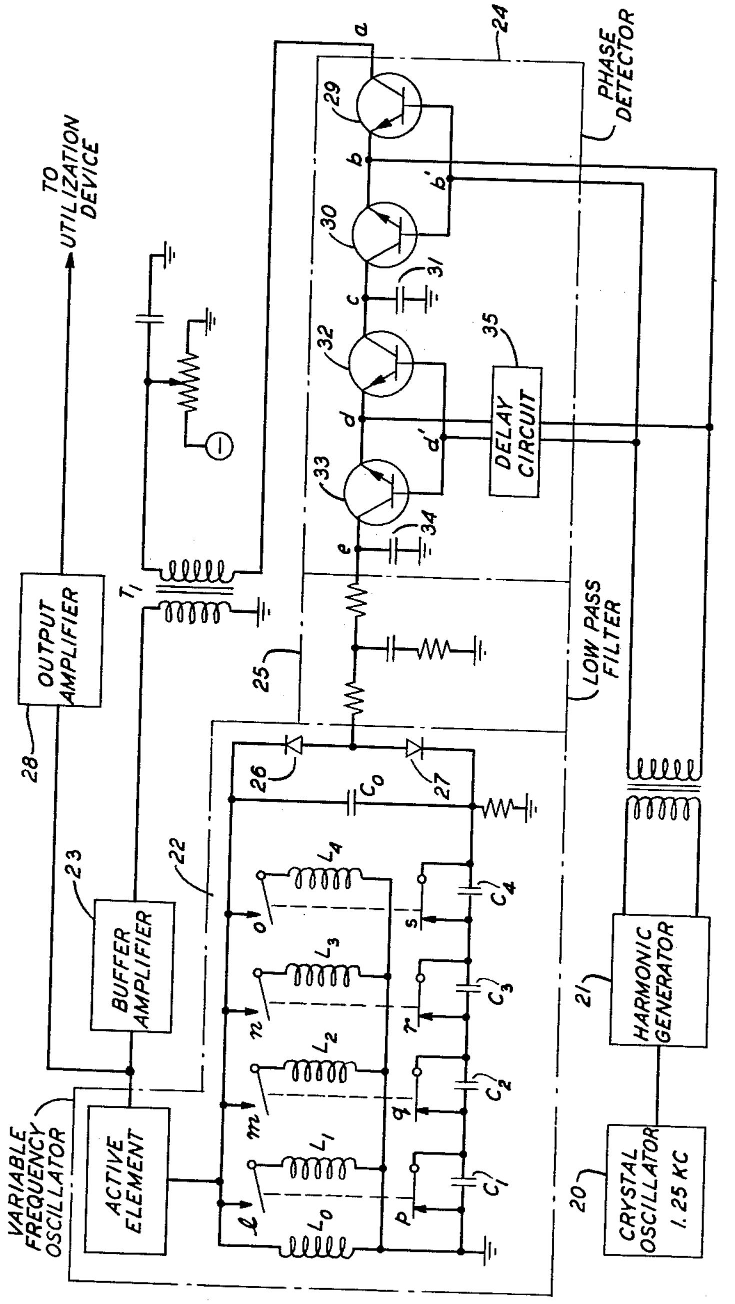
FIG. 2 is a schematic diagram, partially in block form, of the channel select oscillator of FIG. 1.

A basic channel select oscillator that may be employed in frequency synthesizers or in mobile radio systems, as shown in FIG. 1, is shown in detail in FIG. 2. The spacing between the plurality of channels available at the output of the channel select oscillator is determined by the frequency of the output of crystal oscillator 20. The output of crystal oscillator 20 is applied to harmonic generator 21 which may be, for example, a blocking oscillator synchronized to the basic repetition rate of the output from crystal oscillator 20. Harmonic generator 21 provides a signal comprising a plurality of harmonics of the output frequency of crystal oscillator 20. In conjunction with the crystal oscillator 20 and the harmonic generator 21, a phase-locked oscillator is employed as an excellent narrow-band filter to select the desired harmonic from the output of harmonic generator 21.

The phase-locked oscillator comprises variable frequency oscillator 22, which has its output frequency determined by its parallel LC circuit, which is shown in detail in FIG. 2. The output of variable frequency oscillator 22 is fed through a buffer amplifier 23 to a phase detector 24, where it is combined with and compared to the output of harmonic generator 21. The output of the phase detector 24 passes through low-pass filter 25 and is applied to the fine tuning control comprising varactors 26 and 27 of the variable frequency oscillator 22. The output of the variable frequency oscillator that is to serve as the basis of channel selection in a mobile radio system, for example, is applied to its utilization device through an output amplifier 28.

When the channel select oscillator operates over a relatively broad band, it is necessary to provide for coarse tuning of the variable frequency oscillator therein. Due to the physical limitations of the coarse tuning elements, it is also necessary to provide fine tuning of the variable frequency oscillator which responds to the output of the phase loop and phase detector therein. The fine tuning is controlled by the output of the phase detector 24 which is proportional to the sine of the angle determined by the phase difference between the reference signal from the harmonic generator 21 and the output signal from the variable frequency oscillator 22.

When a phase-locked oscillator is used as a sharp filter to select a particular harmonic of a reference signal, thereby providing a plurality of selectable frequencies, there is a possibility of locking to an undesired adjacent channel. This effect may be the result of a dependence of the fine tuning range of the phase-locked oscillator upon the frequency of operation or of a nonlinear relationship that may exist between the channels. The phase-locked oscillator has a particular frequency range, often called the "hold or lock range," in which it will remain in lock, that is, the output of the phase detector is sufficient to keep the variable frequency oscillator at the desired frequency. The fine tuning range of the phase-locked oscillator for any one channel in part determines this frequency range. Therefore, if the fine tuning range is variable, so that it becomes greater than the frequency spacing between adjacent harmonics, the phase-locked oscillator may lock to an undesired harmonic or channel.

Therefore, the coarse tuning elements, inductors $L_1$ through $L_4$ and capacitors $C_1$ through $C_4$, of the variable frequency oscillator 22 are so arranged that the oscillator's frequency determining parallel resonant circuit presents a substantially constant L/C ratio to the variable frequency oscillator 22. Additionally, fine tuning elements 26 and 27 are connected across the constant capacity portion of the frequency determining circuit so that there will be a substantially constant fine tuning range. Thereafter, for each particular frequency of operation, there will be substantially constant tuning of the variable frequency oscillator 22.

The constant L/C ratio is obtained by varying simultaneously the inverse inductance and inverse capacitance of the parallel resonant circuit in a linear and proportionate relationship. This may be accomplished, for example, by simultaneously inserting an inductor in parallel with the initial inductance $L_0$ and a capacitor in series with the initial capacitance $C_0$ of the parallel resonant circuit. It may be shown mathematically that this results in a frequency spacing that is controlled linearly.

A typical example of coarse tuning is shown in FIG. 2, where the variable frequency oscillator 22 may be tuned to a particular channel by closing the switch that controls contacts *m* and *q*, thereby placing inductor $L_2$ in parallel with the initial inductance $L_0$ and capacitor $C_2$ in series with the initial capacitance $C_0$.

This change of inductance and capacitance will result in a change of the frequency of operation. The output signal of variable frequency oscillator 22 will pass through amplifier 23 and will thereafter appear across the primary of transformer $T_1$. The signal will be coupled into the phase sampler or detector 24 where it will be compared to the reference signal from harmonic generator 21. If the change in inductance and capacitance does not select precisely the exact frequency, the phase detector 24 will have a direct-current output that is directly proportional to the sine of the angle determined by phase difference of the two signals. This direct-current voltage will be applied to the fine-tune elements 26 and 27 through low-pass filter 25, thereby making a slight adjustment in the resonant frequency of the variable frequency oscillator's tank circuit to cause a shift to the exact frequency desired.

The phase detector 24 may be a well-known type. One common type requires that the alternating-current potential inputs be at low level to prevent distortion therein. If it is of the type having low input requirements, it will usually be necessary to provide direct-current amplifiers to amplify the output thereof. While such a phase detector may be used, it is desirable to use a phase detector that can accept large alternating-current potentials and still operate effectively, thereby negating the necessity of extra amplification at the direct-current level. One example of such a phase detector is disclosed as a high-speed gating circuit in U.S. Patent 2,899,570 granted J. D. Johannesen et al. on August 11, 1959 and assigned to the same assignee as this application. The phase detector 24 shown in FIG. 2 comprises two of these gating circuits. However, it should be noted that only one is sufficient and is generally used; but for reasons hereinafter discussed, two may be employed. The first gate employs a pair of transistors 29 and 30 connected back-to-back in series in the signal path and the second gate employs a pair of transistors 32 and 33 connected in like manner. The output of the first gate appears across capacitor 31 and the output of the second gate appears across capacitor 34.

Figure 3:
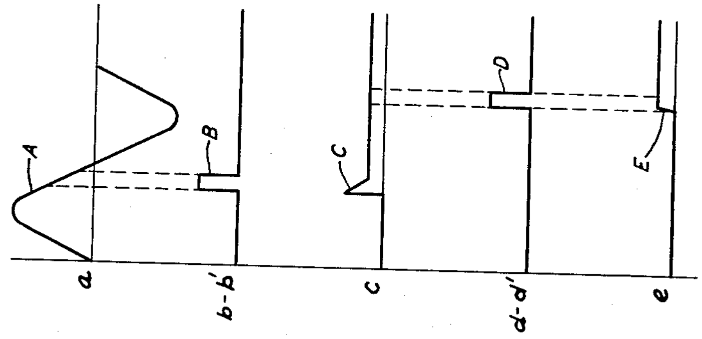
FIG. 3 illustrates the waveforms of certain of the voltages in the phase detector of FIG. 2.

The input signal to the phase detector 24, appearing between point *a* and ground and derived from the variable frequency oscillator 22, is substantially a sine wave and is shown as waveform A in FIG. 3. The gate pulse, which is rich in harmonics of the output frequency of the crystal oscillator 20, is applied from harmonic generator 21 between points *b* and *b'* in the first gate of the phase detector 24. This pulse is shown as waveform B in FIG. 3. The output of the first gate appears across capacitor 31 between point *c* and ground and is shown as waveform C in FIG. 3. From waveform C, it is noted that the output of the first gate has initially a transient that appears as noise at the output of the first gate. To suppress the noise generated in this first gate of the phase detector 24, the second gate is employed. The input pulse from the harmonic generator 21 is delayed by delay circuit 35 and is represented by waveform D in FIG. 3 as appearing between points *d* and *d'*. By delaying this input pulse, the second gate will become operative after the noise has abated in the first gate's output. Therefore, this noise will not appear in the output of the phase detector 24. The output of the phase detector 24 will appear between point *e* and ground and is represented by waveform E in FIG. 3. The output of phase detector 24, now substantially free of noise and representative of the phase difference of the output signal from the variable frequency oscillator 22 and the reference signal from harmonic generator 21, is applied through the low-pass filter 25 to the fine tuning elements comprising varactors 26 and 27 of the variable frequency oscillator's resonant tuning circuit. Low-pass filter 25 transmits the direct-current voltage component of the output of phase detector 24 as a bias to the anodes of varactors 26 and 27. Because of the polarity of the bias applied to point *a*, the direct-current voltage component of the output of phase detector 24 is negative thus providing reverse bias for varactors 26 and 27. It is noted that varactors 26 and 27 are directly across only the initial capacitance of the resonant tuning circuit so that they will have a constant effect regardless of coarse tuning and will therefore result in a constant fine tuning range independent of channel selection.

Where the channel select oscillator is to be used in mobile radio telephone systems, an additional desirable feature is provided by the method of selecting the channel or frequency of operation of variable frequency oscillator 22. There are four switches in the present illustrative case which control the presence or absence of inductors $L_1$ through $L_4$ and capacitors $C_1$ through $C_4$ in the frequency determining circuit of variable frequency oscillator 22. These four switches may be operated separately or in any combination to control the inverse inductance and the inverse capacitance of the frequency determining circuit linearly; and, hence, there is a linear correspondence between the switch combination used, as may be expressed by binary numbers, and the coarse tuning of frequency corresponding to a specific channel. Assume by way of example that $L_0=3$ mh. and $C_0=13{,}500$ $\mu\mu$f., giving oscillator 22 a resulting initial frequency $f_0=25{,}000$ c.p.s., and the values of the insertable inductors and capacitors and the increment of frequency $\Delta f$ attributable to each inductor-capacitor pair are as follows:

| Switch | $\Delta$L (mh.) | KC ($\mu\mu$f.) | $\Delta$F (kc.p.s.) |
|---|---|---|---|
| l, p | $L_1=60$ | $C_1=270{,}000$ | 1.25 |
| m, q | $L_2=30$ | $C_2=135{,}000$ | 2.50 |
| n, r | $L_3=15$ | $C_3=67{,}500$ | 5.00 |
| o, s | $L_4=7.5$ | $C_4=33{,}750$ | 10.00 |

For the values of inductors and capacitors given above, the following table illustrates the switch combinations for selecting any one of the various linearly-related frequencies, the corresponding total effective inductance and capacitance of oscillator 22 for each of these switch combinations, and the total increment of frequency $\Delta f$ attributable to each of these switch combinations.

| Switches Actuated | Frequency Produced (kc.p.s.) | Total Capacitance ($\mu\mu$f.) | Total Inductance (mh.) | Total $\Delta$f (kc.p.s.) |
|---|---|---|---|---|
| None | 25.00 | 13,500 | 3 | 0 |
| l, | 26.25 | $\frac{270{,}000}{21}$ | $\frac{60}{21}$ | 1.25 |
| m, q | 27.50 | $\frac{270{,}000}{22}$ | $\frac{60}{22}$ | 2.50 |
| l, p; m, q | 28.75 | $\frac{270{,}000}{23}$ | $\frac{60}{23}$ | 3.75 |
| n, r | 30.00 | $\frac{270{,}000}{24}$ | $\frac{60}{24}$ | 5.00 |
| l, p; n, r | 31.25 | $\frac{270{,}000}{25}$ | $\frac{60}{25}$ | 6.25 |
| m, q; n, r | 32.50 | $\frac{270{,}000}{26}$ | $\frac{60}{26}$ | 7.50 |
| l, p; m, q; n, r | 33.75 | $\frac{270{,}000}{27}$ | $\frac{60}{27}$ | 8.75 |
| o, s | 35.00 | $\frac{270{,}000}{28}$ | $\frac{60}{28}$ | 10.00 |
| l, p; o, s | 36.25 | $\frac{270{,}000}{29}$ | $\frac{60}{29}$ | 11.25 |
| m, q; o, s | 37.50 | $\frac{270{,}000}{30}$ | $\frac{60}{30}$ | 12.50 |
| l, p; m, q; o, s | 38.75 | $\frac{270{,}000}{31}$ | $\frac{60}{31}$ | 13.75 |
| n, r; o, s | 40.00 | $\frac{270{,}000}{32}$ | $\frac{60}{32}$ | 15.00 |
| l, p; n, r; o, s | 41.25 | $\frac{270{,}000}{33}$ | $\frac{60}{33}$ | 16.25 |
| m, q; n, r; o, s | 42.50 | $\frac{270{,}000}{34}$ | $\frac{60}{34}$ | 17.50 |
| l, q; m, q; n, r; o, s | 43.75 | $\frac{270{,}000}{35}$ | $\frac{60}{35}$ | 18.75 |

It can be seen from the above table that by employing any one of 16 possible combinations of switches, any one of 16 linearly-related frequencies can be selected. Thus, there is provided an effective binary control of the channel selection whereby up to 16 channels are available by the provision of only 4 switches.

Therefore, when a channel select oscillator having a plurality of channels available is employed in a mobile radio telephone system, one channel may be effectively used for a data link between the mobile station and a central office. Supervisory information may then be supplied on this channel so that the mobile station may be automatically tuned to an idle channel and will not require any tuning by the operator. This would result in increased efficiency of operation and substantially complete utilization of all of the available channels assigned in the mobile radio telephone frequency range.

The above specific embodiment where a multi-frequency generator or channel select oscillator is used in a mobile radio system is not to be limiting, but only illustrative. There are many possible uses for such a linear frequency generator. For example, it may be used for laboratory work where it is necessary to have a plurality of frequencies spaced an exact frequency apart and having a linear relationship.

It is additionally noted that the principles of this invention are not limited to a linear-frequency generator, but may be applied to a linear-period generator, that is, the output has a periodicity that is linearly related for each succeeding channel. This may be accomplished by controlling the inductance and capacitance rather than the inverse inductance and inverse capacitance of the frequency determining circuit simultaneously, linearly, and proportionately. Therefore, the inductors would be inserted in series with the initial inductance and the capacitors would be inserted in parallel with the initial capacitance.

There are also many possible uses for a linear-period oscillator. For example, it may be employed for linear time measurement or linear time division, dividing time intervals into equal, integrally related, subperiods, thereafter to be employed as range markers on radar displays.

What is claimed is:

1. In a multifrequency generator, the combination comprising a stable frequency source, means responsive to said source for producing the harmonics of the signal output of said source, a second source including a variable frequency oscillator, means for comparing the phase of the output signal from said harmonic producing means to that of the output signal from said second source and producing a direct-current voltage that is directly proportional to the phase difference, said oscillator of said second source having a frequency determining circuit comprising a permanently connected inductor in parallel with a permanently connected capacitor, means for changing the frequency of operation of said oscillator comprising a plurality of inductor and capacitor combinations insertable in said frequency determining circuit, said inductors being insertable in parallel with said permanently connected inductor and said capacitors being insertable in series with said permanently connected capacitor, said combinations having essentially equal inductance to capacitance ratio, and means for finely tuning said oscillator by locking its frequency of operation to one of the frequencies in the signal output of said harmonic producing means, said fine tuning means comprising a variable capacitor connected in parallel with said first capacitor and having a value of capacitance determined by a voltage applied thereto, and means for applying the direct-current output voltage from said comparing means to said variable capacitor.

2. In a communication system having a standard signal source generating a plurality of frequency components, an oscillator to be synchronized to one of the frequency components of said standard source, and means for detecting the difference in phase between the output from said oscillator and a selected one of the frequency components of said standard source, a frequency determining network for said oscillator comprising a permanently connected circuit having inductive and capacitive types of reactive elements, a plurality of temporarily connectable circuits each having inductive and capacitive types of reactive elements forming element pairs adapted to be insertable selectively into said frequency determining network in order to become a part thereof, the capacitive type element of each pair being connectable in series relationship with the capacitive type element of the permanently connected circuit and the inductive type element of each pair being connectable in parallel relationship with the inductive type element of the permanently connected circuit, the ratio of inductance of capacitance of each of said pairs being equal to the ratio of inductance to capacitance of said permanently connected circuit, and a reactive element of one of said types adjustable over a continuous range responsive to the phase difference indicated by said detecting means, said continuously adjustable reactive element being permanently connected to the same type of reactive element of the permanently connected circuit in the same relationship in which the other type of reactive element of each temporarily connectable circuit is connectable to the other type of reactive element of the permanently connected circuit.

3. In a multifrequency generator, an oscillator and a frequency determining network for said oscillator, said frequency determining network comprising a permanently operative circuit having inductive and capacitive types of reactive elements, a plurality of temporarily operative circuits capable of being selectively employed to change the frequency of said oscillator, each of said temporarily operative circuits having inductive and capacitive types of reactive elements, one type of element of each temporarily operative circuit being connected in parallel with the same type of reactive element of the permanently operative circuit when said temporarily operative circuit is operative, the other type of reactive element of each temporarily operative circuit being connected in series with the same type of reactive element of the permanently operative circuit when said temporarily operative circuit is operative, the ratio of inductance to capacitance of each of said temporarily operative circuits being substantially equal to the ratio of inductance to capacitance of said permanently operative circuits.

4. The apparatus defined in claim 3 wherein said temporarily operative circuits comprise reactive elements that are weighted in value of reactance such that different linearly related frequencies are produced by different combinations of said temporarily operative circuits, the total number of temporarily operative circuits being less than the number of linearly related frequencies producible.

5. A multifrequency generator comprising an oscillator and a frequency determining network having a permanently connected inductor and a permanently connected capacitor in parallel and a plurality of inductor-capacitor pairs having inductance to capacitance ratios equal to the inductance to capacitance ratio of said permanently connected inductor and permanently connected capacitor, each adapted to be connected selectively into said frequency determining network to alter the frequency of operation of said oscillator, the capacitors of each of said pairs being connectable in series with said permanently connected capacitor and the inductors of said pairs being connectable in parallel with said permanently connected inductor.

References Cited in the file of this patent

UNITED STATES PATENTS

| | | |
|---|---|---|
| 2,205,190 | Farrington | June 18, 1940 |
| 2,295,173 | Hoffmann et al. | Sept. 8, 1942 |
| 2,790,072 | Hugenholtz et al. | Apr. 23, 1957 |
| 2,868,973 | Jensen et al. | Jan. 13, 1959 |
| 3,030,588 | Hugenholtz | Apr. 17, 1962 |